United States Patent
Barbe et al.

(10) Patent No.: US 7,625,811 B2
(45) Date of Patent: Dec. 1, 2009

(54) METHOD FOR PRODUCING DISTINCT FIRST AND SECOND ACTIVE SEMI-CONDUCTING ZONES AND USE THEREOF FOR FABRICATING C-MOS STRUCTURES

(75) Inventors: Jean-Charles Barbe, Grenoble (FR); Laurent Clavelier, Voiron (FR); Benoit Vianay, Grenoble (FR); Yves Morand, Grenoble (FR)

(73) Assignees: Commissariat a l'Energie Atomique, Paris (FR); STMicroelectronics SA, Montrouge (FR)

( * ) Notice: Subject to any disclaimer, the term of this patent is extended or adjusted under 35 U.S.C. 154(b) by 627 days.

(21) Appl. No.: 11/584,635

(22) Filed: Oct. 23, 2006

(65) Prior Publication Data
US 2007/0105315 A1 May 10, 2007

(30) Foreign Application Priority Data
Nov. 9, 2005 (FR) .................................. 05 11424

(51) Int. Cl.
H01L 21/20 (2006.01)
H01L 21/36 (2006.01)
H01L 21/8238 (2006.01)

(52) U.S. Cl. ...................... 438/479; 438/199; 438/219; 438/311; 257/E21.561; 257/347

(58) Field of Classification Search ................ 438/142, 438/219, 295, 355, 404, 311, 479; 257/369, 257/E21.561, E29.287
See application file for complete search history.

(56) References Cited

U.S. PATENT DOCUMENTS

| | | | |
|---|---|---|---|
| 4,751,561 A | 6/1988 | Jastrzebski | |
| 5,514,885 A | 5/1996 | Myrick | |
| 7,439,110 B2 * | 10/2008 | Cheng et al. | 438/150 |
| 2002/0019105 A1 | 2/2002 | Hattori et al. | |
| 2002/0140033 A1 | 10/2002 | Bae et al. | |
| 2005/0104131 A1 * | 5/2005 | Chidambarrao et al. | 257/369 |

OTHER PUBLICATIONS

Liu, Yaocheng et al., "MOSFETs and High-Speed Photodetectors on Ge-on-Insulator Substrates Fabricated using Rapid Melt Growth," Center for Integrated Systems, XP010788979, pp. 1001-1004 (2004).

Liu, Yaocheng et al., "High-quality single-crystal Ge on insulator by liquid-phase epitaxy on substrates," Applied Physics Letters, vol. 84, No. 14, pp. 2563-2565 (Apr. 2004).

* cited by examiner

*Primary Examiner*—Ha Tran T Nguyen
*Assistant Examiner*—Aaron A Dehne
(74) *Attorney, Agent, or Firm*—Oliff & Berridge, PLC

(57) ABSTRACT

A method according to the invention enables first and second active zones to be produced on a front face of a support, which said zones are respectively formed by first and second monocrystalline semi-conducting materials that are distinct from one another and preferably have identical crystalline structures. The front faces of the first and second active zones also present the advantage of being in the same plane. Such a method consists in particular in producing the second active zones by a crystallization step of the second semi-conducting material in monocrystalline form, from patterns made of second semi-conducting material in polycrystalline and/or amorphous form and from interface regions between said patterns and preselected first active zones. Moreover, the support is formed by stacking of a substrate and of an electrically insulating thin layer, the front face of the electrically insulating thin layer forming the front face of the support.

14 Claims, 4 Drawing Sheets

METHOD FOR PRODUCING DISTINCT FIRST AND SECOND ACTIVE SEMI-CONDUCTING ZONES AND USE THEREOF FOR FABRICATING C-MOS STRUCTURES

BACKGROUND OF THE INVENTION

The invention relates to a method for producing first and second active zones, on the front face of a support, which zones are respectively formed by first and second monocrystalline semi-conducting materials that are distinct from one another and comprise coplanar front faces.

The invention also relates to use of such a method for fabricating C-MOS structures.

STATE OF THE ART

To improve the performances of C-MOS integrated circuits, substrates called hybrid substrates are used. Such substrates support two types of semi-conducting active regions. Thus, one type of active regions is designed for fabrication of n-MOS transistors whereas the other type is designed for fabrication of p-MOS transistors. Current methods for fabricating such hybrid substrates are relatively complex and consequently costly.

Moreover, the U.S. Pat. No. 5,514,885 proposes a method for producing a hybrid substrate designed to be used in fabricating circuits such as charge coupling devices (CCD), integrated digital memories, microprocessors and integrated analog circuits. The method consists in forming active zones of crystalline GaAs next to active zones of monocrystalline silicon obtained by etching a bulk silicon substrate. The surface of a bulk monocrystalline silicon substrate is in this way patterned, and more particularly etched, so as to form salient regions in the bulk monocrystalline silicon substrate. Saif salient regions are designed to constitute germination windows to form the active GaAs monocrystalline zones. A thin layer of thermal $SiO_2$ or of $SiO_2$—$Al_2O_3$ is then deposited on the surface of the substrate, and is then etched to expose a part of the top wall of said salient regions. A layer of polycrystalline or amorphous GaAs is then deposited on the surface of the substrate partly covered by the layer of thermal $SiO_2$ or of $SiO_2$—$Al_2O_3$. Then a dielectric protection layer is deposited on the polycrystalline or amorphous GaAs layer, before a light impulse, uniform in space, is applied to melt the polycrystalline or amorphous GaAs layer so that the GaAs is recrystallized in monocrystalline form, from the salient regions. A planarization step then enables coplanar active zones of monocrystalline GaAs and active zones of monocrystalline silicon to be obtained. The active monocrystalline GaAs zones are separated from the monocrystalline silicon substrate, and more particularly from the active monocrystalline silicon zones, by the layer of thermal $SiO_2$ or of $SiO_2$—$Al_2O_3$.

OBJECT OF THE INVENTION

The object of the invention is to simplify fabrication of hybrid substrates and, in particular, fabrication of C-MOS structures.

According to the invention, this object is achieved by the appended claims.

More particularly, this object is achieved by the fact that the support is formed by stacking of a substrate and of an electrically insulating thin layer, the front face of the electrically insulating thin layer constituting the front face of the support, and that the method comprises at least the following successive steps:

formation, on the front face of the electrically insulating thin layer, of the first active zones at least the side walls whereof are covered by a thin protective layer, patterning of the thin protective layer so as to free interface regions in the side walls of preselected first active zones, intercalation between the first active zones, on the front face of the electrically insulating thin layer, of patterns made of second semi-conducting material in polycrystalline and/or amorphous form, each pattern comprising at least a part of a side wall in direct contact with an interface region of an adjacent preselected first active zone and a front face disposed in the same plane as the front faces of the first active zones, deposition of a passivation layer on the first active zones and the patterns, and crystallization of the second semi-conducting material in monocrystalline form so as to form the second active zones.

More particularly, when such a method is used for fabricating C-MOS structures, the first and second active zones being respectively made of silicon and germanium, n-MOS transistors are formed in the first active zones and p-MOS transistors are formed in the second active zones.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
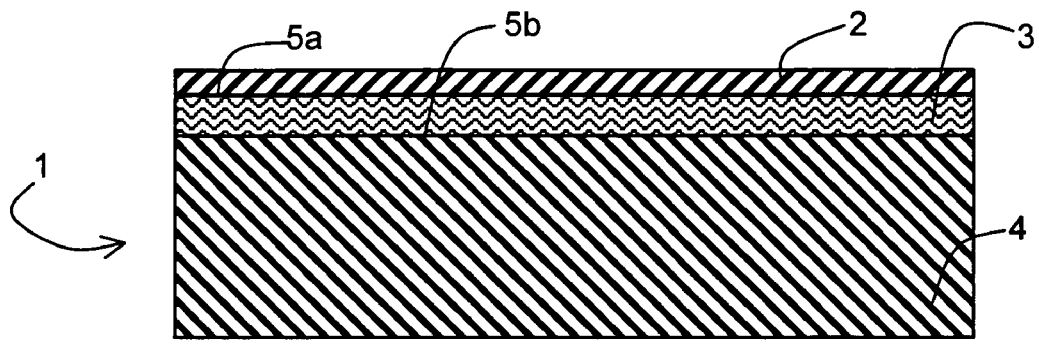
FIGS. 1 to 10 schematically represent the different steps of a particular embodiment of the invention in cross-section.

A method according to the invention enables first and second active zones, respectively formed by distinct first and second monocrystalline semi-conducting materials, to be achieved simply and inexpensively on the front face of a support. In addition, it enables the front faces of the first and second active zones to be in the same plane as one another, and the first and second semi-conducting materials preferably have identical crystalline structures.

Such a method consists in particular in producing the second active zones by a crystallization step of the second semi-conducting material in monocrystalline form from patterns made of second semi-conducting material in polycrystalline and/or amorphous form and from interface regions between said patterns and preselected first active zones.

According to a particular embodiment, the crystallization step is preferably performed by a localized solidification method. In this case, the second semi-conducting material has a lower melting temperature than that of the first semi-conducting material. The localized solidification method is also called Liquid-Phase Epitaxy (LPE).

It has already been proposed to use the localized solidification method to form monocrystalline germanium from a seed zone of monocrystalline silicon formed on a front face of a bulk silicon substrate. Thus, Yaocheng Liu et al., in the article "High-quality single-crystal Ge on insulator by liquid-phase epitaxy on Si Substrates (Applied Physics Letters, Vol 84, No 14, pages 2563-2565) propose, with the localized solidification method, to produce a germanium on insulator (GeOI) substrate, i.e. a stack successively comprising a thin film of monocrystalline germanium, an electrically insulating thin layer and a bulk silicon substrate. The thin film of monocrystalline germanium is in fact achieved on a bulk silicon substrate, provided with an electrically insulating thin layer on the front face thereof. A part of the front face of the bulk silicon substrate is previously freed to form a free zone called seed zone. Then germanium is deposited by sputtering and rapid thermal treatment is performed to make the germanium go to liquid state. The germanium is then cooled to make it go to solid state, in monocrystalline form. Solidification is performed from the seed zone created in the bulk monocrystalline silicon substrate, and then propagates laterally in the liquid germanium until it forms the thin film of monocrystalline germanium.

However, the localized solidification method used in the particular embodiment of the invention is used to produce a hybrid substrate, i.e. to produce distinct first and second semiconducting active zones on the front face of a support. The second active zones are achieved by localized solidification from interface regions, called seed regions, of a side wall of first active zones preselected from the previously formed first active zones. This notably enables the front faces of the first and second active zones to be in the same plane as one another and to therefore be coplanar.

Thus, FIGS. 1 to 10 illustrate a particular embodiment of the invention consisting in forming first active zones of monocrystalline silicon and second active zones of monocrystalline germanium on the front face of a support. Furthermore, the first active zones are made of a silicon-on-insulator (SOI) substrate 1 such as the one represented in FIG. 1. The SOI substrate 1 comprises a stack formed by a thin film 2 of monocrystalline silicon, an electrically insulating thin layer 3 and a substrate 4.

The thin film 2 preferably has a thickness comprised between a few nanometers and a few micrometers and, more particularly, comprised between 10 nm and 100 nm. The substrate 4 is for example made of silicon. It can also be formed by any other type of material conventionally used to form SOI substrates 1. Moreover, the substrate 4 preferably has a shorter thermal stabilization characteristic time than that of the electrically insulating thin layer 3.

The electrically insulating thin layer 3 is also called the buried layer. As represented in FIG. 1, it is arranged between the thin film 2 and the substrate 4. It thus comprises a front face 5a in contact with the thin film 2 and a rear face 5b in contact with the substrate 4. The front face 5a is preferably flat and then constitutes the front face of the support on which the first and second active zones are produced. The thickness of the thin layer 3 is preferably comprised between a few nanometers and a few micrometers.

More particularly, the thin layer 3 is formed by an amorphous material so as to prevent nuisance germination of the germanium, from the front face 5a of the thin layer 3, when a subsequent step of the method is performed. The thin layer 3 can for example be formed by a thin layer of amorphous silicon nitride or of amorphous silicon dioxide. It can also be formed by a bilayer formed by a thin layer of amorphous silicon nitride and a thin layer of amorphous silicon dioxide. It can also comprise other materials or be formed by a multilayer stack, provided that the material designed to be in contact with germanium does not subsequently cause germination of the germanium. Thus, the front face 5a of the thin layer 3 is preferably chemically stable with respect to germanium. Furthermore, the material(s) forming the thin layer 3 is (are) preferably chosen such that thermal stabilization characteristic time of the thin layer 3 is longer than that characterizing germanium. At a first approximation, said characteristic time corresponds to the general formula: $\tau_i = I_i^2/(k_i(\rho_i \times C_i)$ with i corresponding to the reference of the layer considered (for example i=3 for the dielectrically insulating thin layer 3), $I_i$ corresponding to a characteristic length of the layer i. $k_i$, $\rho_i$ and $C_i$ correspond respectively to the thermal conductivity, the density and the calorific capacity of the material forming the layer i. Thus, for the thin layer 3, $I_3$ corresponds to the thickness of the thin layer 3 and for a pattern i made of polycrystalline and/or amorphous germanium, $I_i$ corresponds to the width of said pattern.

Figure 2:
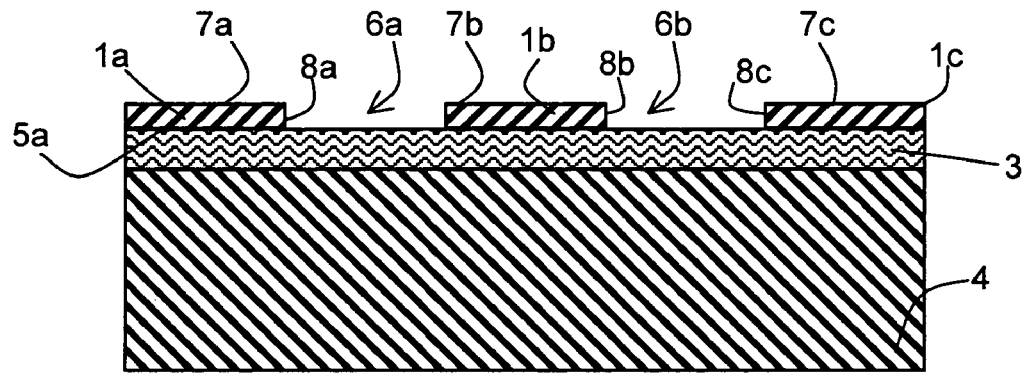

As illustrated in the FIGS. 1 and 2, the first active zones are produced in the thin film 2 of the SOI substrate 1. They are, more particularly, produced by photolithography of the thin film 2 through a photoresist mask (not shown), the latter then being removed. Thus, in FIG. 2, three first active zones 1a, 1b and 1c are represented. They are separated from one another by two spaces 6a and 6b freeing parts of the front face 5a of the thin layer 3. The first zones 1a, 1b and 1c each comprise a front face and a side wall. Thus, the first zone 1a comprises a front face 7a and a side wall 8a, the first zone 1b comprises a front face 7b and a side wall 8b and the first zone 1c comprises a front face 7c and a side wall 8c.

Figure 3:
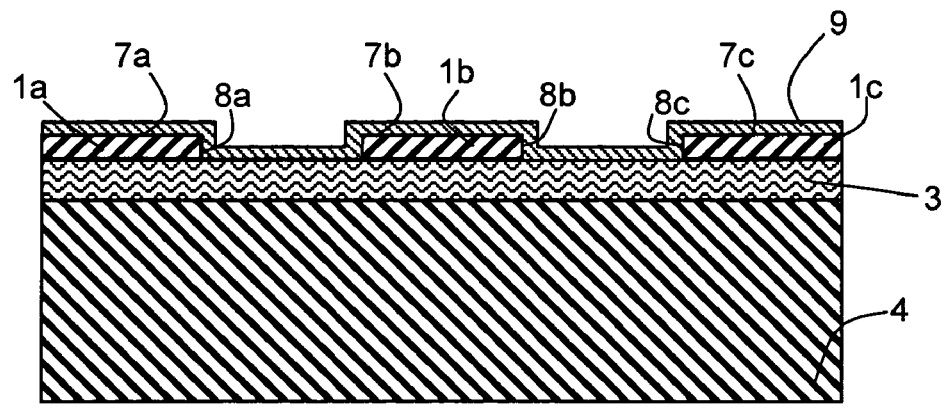

In FIG. 3, a protective layer 9 is deposited uniformly in such a way as to cover the front faces 7a, 7b and 7c and the side walls 8a, 8b and 8c of the first active zones 1a, 1b and 1c. Depositing the protective layer 9 uniformly is commonly referred to by a person skilled in the art as conformal deposition. Conformal deposition corresponds to a deposition for which the protective layer presents a constant thickness regardless of the geometry of the surface on which said deposition is made. The protective layer 9 also covers the free parts of the front face 5a of the thin layer 3. The protective layer 9 is for example a silicon dioxide layer and it can be deposited by any type of vacuum deposition method. For example, the deposition method can be a physical vapor deposition (PVD) such as plasma enhanced physical vapor deposition (PECVD) or a chemical vapor deposition (CVD). According to an alternative, the protective layer 9 can also be obtained by thermal oxidation of silicon. The protective layer 9 can also be formed by a stack of several thin layers provided that the thin layer designed to be in contact with germanium does not subsequently cause germination of the latter.

The protective layer 9 is then patterned so as to free regions called interface regions, in the side walls of preselected first active zones and corresponding to regions called seed regions. Patterning is for example performed by a photolithography step followed by an etching step. Patterning is more particularly performed by means of a photoresist layer deposited on the protective layer 9. The photoresist layer is then exposed and developed so as to form a mask covering a part of the protective layer 9. The part of the protective layer 9 not covered by the mask then corresponds to the freed part of the protective layer 9. The freed part of the protective layer 9 is then eliminated by etching whereas the part of the protective layer 9 covered by the mask remains protected. The mask is then removed. Etching is for example chemical etching. For example, a protective layer of $Si_3N_4$ can be etched with a solution of phosphoric acid ($H_3PO_4$) and, for a protective layer of $SiO_2$, etching can be performed with a hydrofluoric acid solution. Furthermore, if the protective layer 9 is formed by stacking of two layers, respectively of $SiO_2$ and $Si_3N_4$, and if the $SiO_2$ layer is in contact with the first active zones 1a, 1b and 1c, said $SiO_2$ layer can act as a barrier stopping etching of the $Si_3N_4$ layer achieved by means of a solution rich in $H_3PO_4$.

Figure 4:
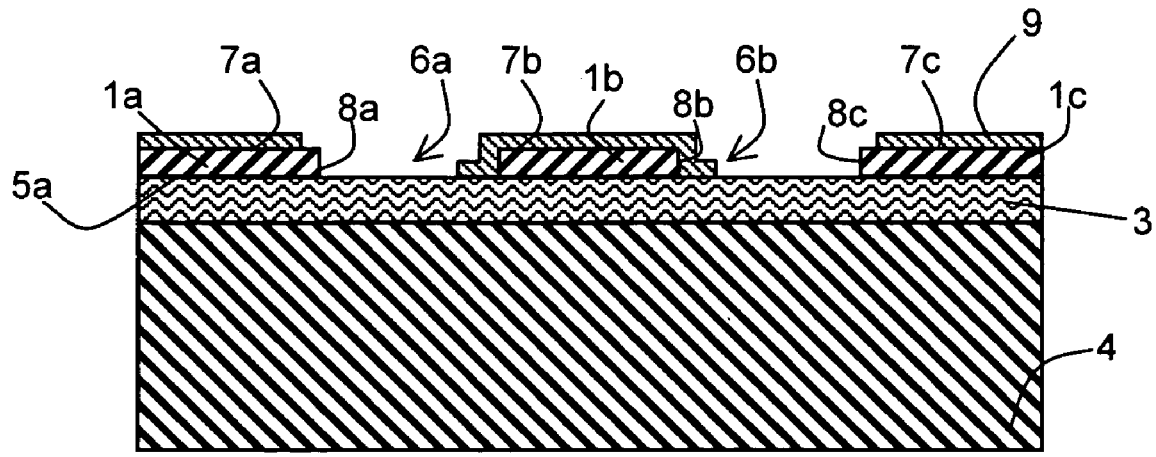

In FIG. 4, patterning of the protective layer 9 has been performed so as to free interface regions in the side walls 8a and 8c, respectively of the first zones 1a and 1c. The side wall 8b of the first zone 1b remains, for its part, protected by the protective layer 9. In addition, the two freed interface regions each correspond to the part of the side wall 8a or 8b of the corresponding preselected first zone active 1a or 1c, delineating a space 6a or 6b.

In the embodiment represented in FIG. 4, the front faces 7a, 7b and 7c of the first active zones 1a, 1b and 1c remain partially covered by the protective layer 9. Patterning of the protective layer 9 on the other hand enables the parts of the front face 5a of the thin layer 3 that delineate the spaces 6a and 6b to be at least partially freed. This leads to formation of the barrier elements 9a and 9b designed to protect the side wall of a non-preselected first active zone.

At least partial freeing of said parts of the front face 5a of the thin layer 3 is only possible if the materials respectively forming the protective layer 9 and the thin layer 3 are different and if etching of the protective layer 9 is selective with respect to the material(s) forming the thin layer 3. This is for example the case if the thin layer 3 is made of $Si_3N_4$, the protective layer 9 is made of $SiO_2$, and if etching of the protective layer 9 is performed with a hydrofluoric acid solution. In other cases, patterning of the protective layer 9 could stop or be stopped before reaching the interface between the protective layer 9 and the thin layer 3. It could also be continued in the thin layer 3. The thickness of the material of the thin layer 3 consumed would then correspond to the thickness of the over-etching with respect to an ideal etching and corresponding to stopping etching at the interface between the protective layer 9 and the thin layer 3.

Figure 6:
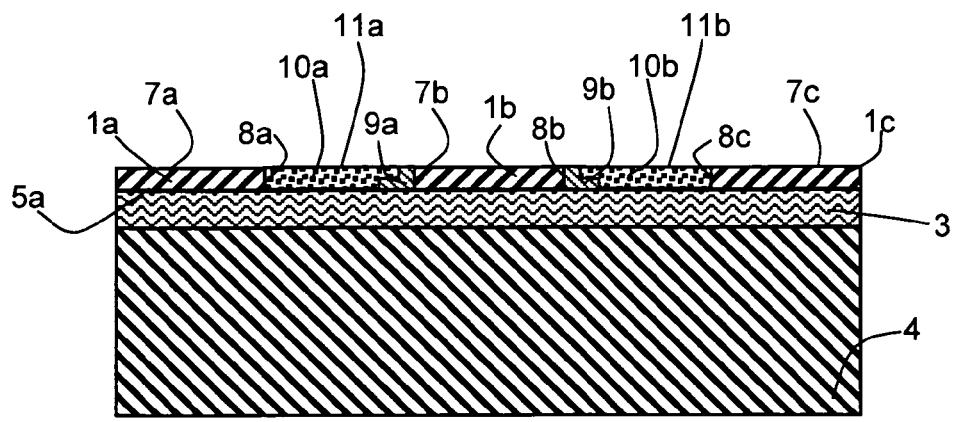

As illustrated in FIG. 6, patterns 10a and 10b made of polycrystalline and/or amorphous germanium are then intercalated between said first active zones 1a, 1b and 1c, on the free parts of the front face 5a of the thin layer 3. Each pattern 10a, 10b presents a front face 11a, 11b in the same plane as the front faces 7a, 7b and 7c of the first active zones 1a, 1b and 1c and it comprises at least a part of a side wall in direct contact with the interface region of an adjacent preselected first active zone. Thus, in FIG. 6, a part of the side wall of the pattern 10a is in direct contact with the interface region of the first zone active 1a whereas, for the pattern 10b, a part of the side wall thereof is in direct contact with the interface region of the first active zone 1c. The other parts of the side walls of the patterns 10a and 10b are, for their part, separated from the side walls of the first active zones by barrier elements 9a and 9b formed by a remaining part of the protective layer 9.

Figure 5:
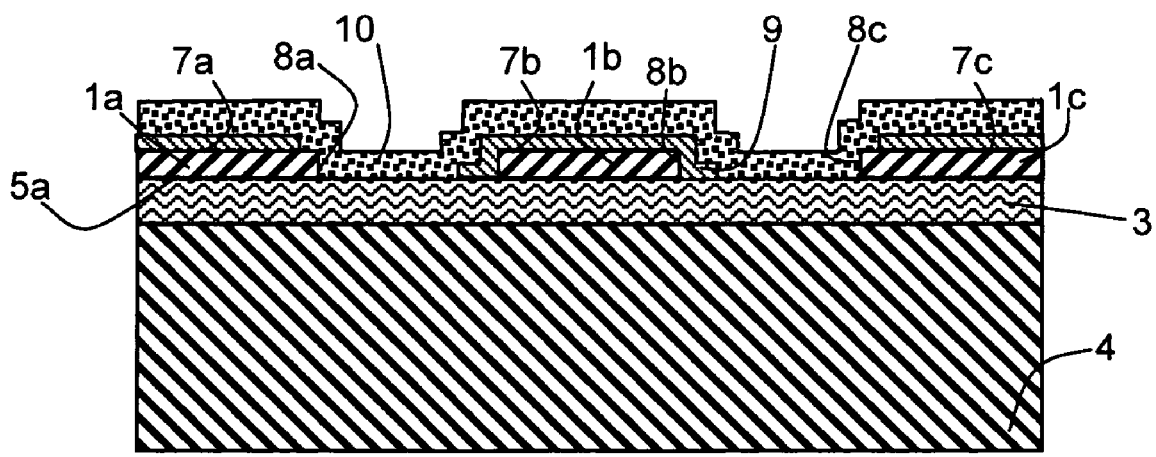

As represented in FIG. 5, this intercalation is for example achieved by uniformly depositing (conformal deposition) a layer 10 of germanium in polycrystalline and/or amorphous form on the whole of the free surface of the structure represented in FIG. 4. Conformal deposition is for example performed by physical vapor deposition or by chemical vapor deposition.

According to a particular embodiment, conformal deposition can be performed in two distinct deposition steps. The first step, for example PECVD step, can enable deposition of germanium to be started uniformly whereas the second step can be a more standard and less costly deposition step, for example a CVD or PVD step. This second step enables deposition to be completed up to the required thickness for the layer 10. In this particular embodiment, the layer 10 is then formed by two superposed sub-layers, the first being amorphous and the second being polycrystalline. With this particular embodiment, the first amorphous sub-layer forms a layer called the wetting layer, on the free surface of the structure as represented in FIG. 4, which layer presents the advantage of being uniform whatever the material constituting the surface on which it is deposited. Deposition of the second sub-layer can then be performed without difficulty, as deposition of the first sub-layer prevents the nucleation barrier problem which is liable to occur when depositing any material on a surface of different nature.

This conformal deposition step is then followed by a planarization step, such as chemical-mechanical polishing (CMP). This planarization step enables the patterns 10a and 10b as represented in FIG. 6 to be obtained. More particularly, it enables the front faces 11a and 11b of the patterns 10a and 10b to be in the same plane as the front faces 7a, 7b and 7c. Thus, in the embodiment represented in FIG. 5, the thickness of the layer 10 being equal to the thickness of the first active zones 1a, 1b and 1c, chemical-mechanical polishing will be performed so as to only eliminate the parts of the layer 10 disposed on the front faces 7a, 7b and 7c. Thus, polishing only stops once the protective layer 9 has been reached. Preferably, it only stops at the interface between the protective layer 9 and the first active zones 1a, 1b and 1c, thus freeing the front faces 7a, 7b and 7c (FIG. 6). The means for determining the moment etching is to be stopped are well known to a person skilled in the art. For example, a person skilled in the art will be able to use an end-of-etching detection system or a method for measuring the variation of the torque exerted on the polishing machine motor, depending on the nature of the materials.

Figure 7:
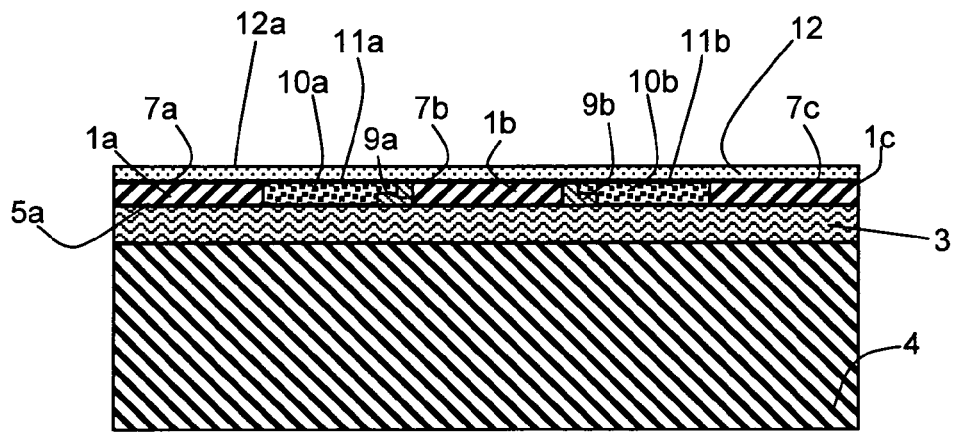

A relatively thick and rigid passivation layer 12 is then deposited on the flat free surface of the structure represented in FIG. 6, i.e. on the front faces 7a, 7b and 7c of the first active zones and on the front faces 11a and 11b of the patterns 10a and 10b (FIG. 7). Moreover, the material of the passivation layer 12, designed to be in contact with the front faces 11a and 11b of the germanium patterns 10a and 10b, is preferably amorphous. The passivation layer 12 performs in particular protection of the first active zones 1a, 1b and 1c and of the patterns 10a and 10b against the outside environment, in particular during the steps performed at high temperature.

Figure 8:
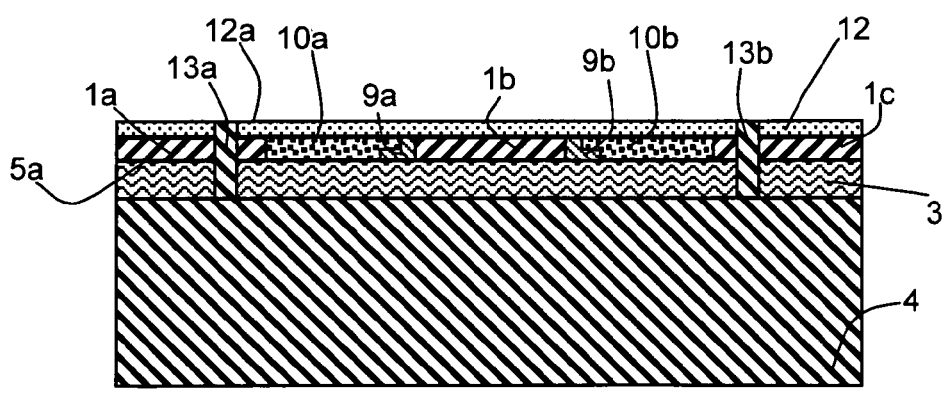

Preferably, in FIG. 8, transverse passages are formed between the substrate 4 and the front face 12a of the passivation layer 12. The transverse passages are formed so as to pass through the thin layer 3 and the first active zones 1a and 1c, near the interface regions. Then the passages are filled with a heat conducting material so as to form heat sinks 13a and 13b. According to an alternative, the heat sinks 13a and 13b can be formed before the passivation layer 12 is deposited. In this case, transverse passages are formed between the first active zones comprising the interface regions, i.e. the first active zones 1a and 1c in FIG. 5, and the substrate 4.

The heat conducting material filling the transverse passages can be monocrystalline silicon. Filling of the transverse passages is then preferably achieved by vacuum deposition, for example by PVD, CVD or LPCVD or by epitaxy. The heat conducting material can also be another material than the material forming the first active zones. In this case, it is chosen such as to have a high heat conduction, preferably greater than or equal to that of the first active zones. It is also non-contaminant, i.e. it must not modify the semi-conducting properties of the first active zones or make the thin layer 3 lose its electrically insulating nature. Furthermore, the material filling the transverse passages can be chosen such as not to generate crystalline defects in the first active zones 1a, 1b and 1c. Preferably, the heat conducting material is chosen such as to have the closest possible thermal and thermoelastic properties to those of the material forming the first active zones 1a, 1b and 1c.

The patterns 10a and 10b are then crystallized by localized solidification. Thus, the structure as represented in FIG. 8 undergoes thermal treatment designed to heat the patterns 10a and 10b to a temperature comprised between the melting temperatures of germanium and of silicon. The melting temperature of germanium being 937° C. whereas that of silicon is about 1414° C., the thermal treatment is for example performed at a temperature of about 950° C., during a very short time. This enables the germanium patterns 10a and 10b to be melted while keeping the first active zones in solid form and preventing the materials presenting a viscous behavior from having the time to deform irreversibly.

The passivation layer 12 plays a mechanical protection and thermal insulation role when melting of the germanium is performed. It is moreover sufficiently thick and rigid. This prevents it from flaring under the effect of a pressure increase liable to occur when the germanium melts and the heat flux removed via its free face, by convection and/or radiation, from causing faster cooling than that which should take place through the substrate 4. The passivation layer 12 is, for example, made of silicon dioxide, silicon nitride and/or hafnium dioxide.

Furthermore, the heating method used to perform the thermal treatment is preferably chosen such as to heat the polycrystalline and/or amorphous germanium to a higher temperature than its melting temperature while ensuring that the substrate 4 remains a cold thermal mass. Thus, the structure as represented in FIG. 8 is preferably heated by the front face 12a of the passivation layer 12. Heating can be performed by radiation. In this case, the incident radiation wavelength is preferably chosen such as to be absorbed by the material or by one of the materials constituting the passivation layer 12. The passivation layer 12 then enables the underlying germanium to be heated by conduction so that it constitutes a heat zone in the structure represented in FIG. 8. Moreover, the exposure time to the incident radiation is sufficiently short for penetration of the heat wave to only affect a negligible thickness of the substrate 4.

Figure 9:
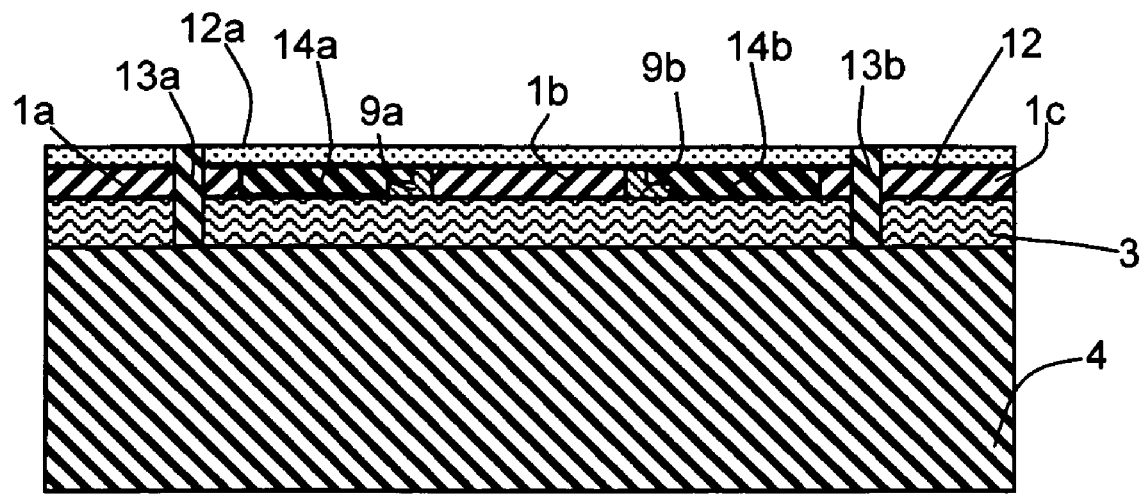
Figure 10:
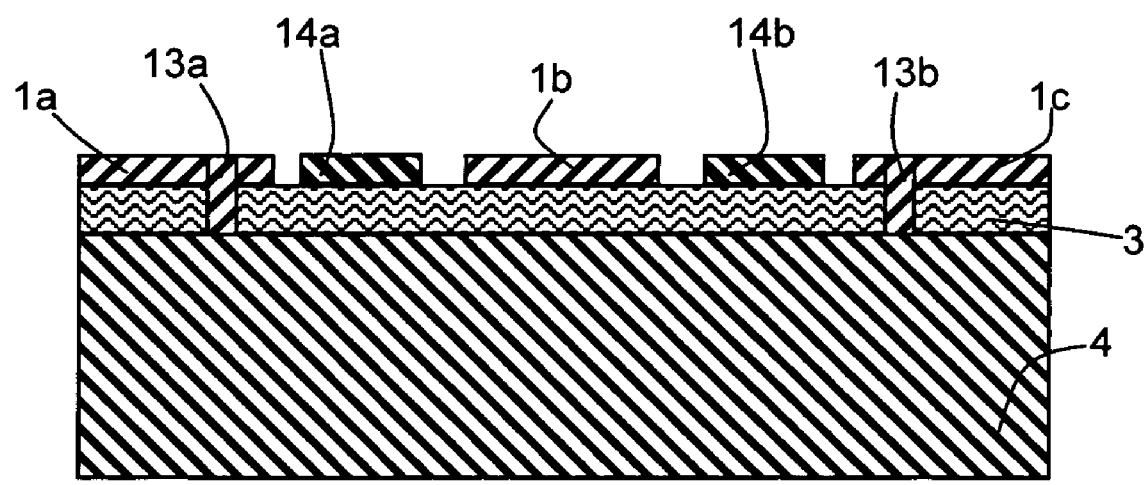

Once the thermal treatment has been completed, the structure is cooled causing solidification of the germanium, in monocrystalline form, and therefore forms the second active zones 14a and 14b as represented in FIG. 9. Cooling is for example obtained by heat removal to the substrate 4 by means of the heat sinks 13a and 13b. The substrate 4 then forms a heat sink in which the thermal power input when thermal treatment was performed can be removed during the solidification step. For this heat sink to be efficient, the heating method used during the thermal treatment step must however have only heated said substrate superficially and/or, during the cooling step, heat removal must take place mainly towards the rear face of the substrate 4, via the heat sinks 13a and 13b.

In this embodiment, crystallization of the germanium in monocrystalline form takes place by localized solidification. Solidification of the germanium in fact begins by germination at the interface regions, called the seed regions, of the first active zones 1a and 1c. Then a solidification front propagates in the germanium in liquid state, substantially horizontally from the seed regions to the opposite side walls protected by the barrier elements 9a and 9b, so as to obtain second active zones 14a and 14b made of monocrystalline germanium.

Once the second active zones 14a and 14b have been formed, the passivation layer 12 can be removed, for example by etching or photolithography, and the first and second active zones can be physically isolated from one another, for example by eliminating the contact regions between a first active zone and an adjacent second active zone (FIG. 9). This also enables electrical insulation to be achieved between the first active zones and the second active zones.

According to an alternative embodiment described above, the protective layer 9 is not necessarily deposited uniformly, as represented in FIG. 3. It can for example be only deposited on the side walls 8a, 8b and 8c of the first active zones 1a, 1b and 1c, forming for example spacers. In this case, the front faces 7a, 7b and 7c of the first active zones remain free, until conformal deposition of the second semi-conducting material. A planarization step, for example by chemical-mechanical polishing (CMP) and/or by selective etching can then be performed so as to eliminate the second semi-conducting material disposed on the front face of the first active zones, with preferably stopping of etching and/or of CMP at the level of the front faces 7a, 7b and 7c of the first active zones 1a, 1b and 1c.

According to another alternative, the protective layer 9 can be deposited uniformly, as represented in FIG. 3, but patterning of the protective layer 9 can be performed in such a way as to also free the front faces 7a, 7b and 7c of the first active zones 1a, 1b and 1c and at least partially free the parts of the front face of the thin layer 3 that also delineate the spaces 6a and 6b. In this case, patterning of the protective layer 9 leads directly to formation in each space 6a and 6b of the barrier elements 9a and 9b represented in FIG. 6 and designed to protect the side walls of the non-preselected first active zones.

Furthermore, an intermediate planarization step can be performed between the patterning step of the protective layer 9 and the intercalation step between the first active zones of the patterns 10a and 10b. This intermediate step can be performed by etching, with stopping at the interface between the protective layer 9 and the first active zones or it can continue into the first active zones. In this case, the thickness of the first active zones is reduced and a planarization step may be necessary after formation of the patterns 10a and 10b so that the front faces 11a and 11b of the patterns 10a and 10b remain in the same plane as the front faces of the first active zones.

In another embodiment, patterning of the protective layer 9 is performed so as to free the parts of the front face 5a of the thin layer 3 delineating the spaces 6a and 6b. This can be achieved either by stopping patterning at the interface between the protective layer 9 and the thin layer 3, or by continuing patterning into the thin layer 3. In this case, the step of intercalating patterns made of polycrystalline and/or amorphous second semi-conducting material between the first active zones is preferably performed by selective deposition of the second semi-conducting material only in the spaces 6a and 6b. For example, in a structure as represented in FIG. 4, the thin layer 3 is made of $Si_3N_4$, the protective layer 9 is made of $SiO_2$ and the first active zones 1a, 1b and 1c are made of silicon and germanium alloy. Chemical vapor deposition is performed selectively to form patterns 10a and 10b made of second semi-conducting material directly in spaces 6a and 6b. The second semi-conducting material presents a lower melting temperature than that of the silicon and germanium alloy. If required, a planarization step can be implemented after formation of the patterns 10a and 10b so as to obtain a structure such as the one represented in FIG. 6.

The invention is not limited to the embodiments described above.

More particularly, the first and the second active zones can be of any shape. The shape of the first and second active zones can for example be chosen such as to trap the crystalline defects liable to form during the germanium crystallization step.

Furthermore, the monocrystalline silicon can be replaced by any type of monocrystalline semi-conducting material having a crystalline structure enabling germanium or another monocrystalline semi-conducting material to be produced by means of a localized crystallization step at the level of an interface region disposed in the side wall of the first active zones. For example, the monocrystalline silicon can be replaced by a silicon and germanium alloy (SiGe) or, if the first semi-conducting material is monocrystalline silicon, the germanium can be replaced by a silicon and germanium alloy.

To achieve crystallization of the second semi-conducting material, the localized solidification method or liquid-phase epitaxy (LPE) can be replaced by a solid-phase epitaxy (SPE). In this case, a solid-phase crystallization step is performed after deposition of the passivation layer 12 so as to form a monocrystal, at the level of the interface regions, which will grow by repetition of several crystallization cycles until the patterns 10a and 10b are totally transformed into monocrystal and form the second active zones 14a and 14b. The second semi-conducting material then does not need to have a lower melting temperature than that of the first semi-conducting material.

The material forming the substrate 4 can be identical to or different from the material constituting the thin film 2.

A method according to the invention presents the advantage of simplifying fabrication of a hybrid substrate used in particular for fabricating C-MOS structures. The method for producing described above can in fact be used for fabricating C-MOS structures, n-MOS transistors being formed in first active zones made of monocrystalline silicon and p-MOS transistors being formed in second active zones made of monocrystalline germanium. It therefore enables fabrication of n-MOS and p-MOS transistors to be treated collectively on one and the same support, which reduces production costs. Indeed, germanium, which is known to improve the performances of MOS transistors, is however very expensive. Integrating it on a support also comprising active zones made of silicon enables the cost of the initial support to be reduced.

The invention claimed is:

1. Method for producing first and second active zones on a front face of a support, which said zones are respectively formed by first and second monocrystalline semi-conducting materials that are distinct from one another and comprise coplanar front faces,
   wherein the support is formed by stacking of a substrate and of an electrically insulating thin layer, a front face of the electrically insulating thin layer constituting the front face of the support
   and wherein the method comprises at least the following successive steps:
      formation, on the front face of the electrically insulating thin layer, of the first active zones, at least side walls whereof are covered by a thin protective layer,
      patterning of the thin protective layer so as to expose interface regions in the side walls of preselected first active zones,
      insertion between the first active zones, on the front face of the electrically insulating thin layer, of patterns made of second semi-conducting material in polycrystalline and/or amorphous form, each pattern comprising at least a part of a side wall in direct contact with an interface region of an adjacent preselected first active zone and a front face disposed in the same plane as the front faces of the first active zones,
      deposition of a passivation layer on the first active zones and the patterns,
      and crystallization of the second semi-conducting material in monocrystalline form so as to form the second active zones.

2. Method according to claim 1, wherein the crystallization is achieved by a localized solidification step.

3. Method according to claim 2, wherein the localized crystallization comprises:
   thermal treatment at a preset temperature comprised between the respective melting temperatures of the first and second materials, the second material having a lower melting temperature than that of the first material
   and solidification of the second semi-conducting material in monocrystalline form so as to form the second active zones.

4. Method according to claim 1, wherein crystallization is achieved by solid-phase epitaxy.

5. Method according to claim 1, wherein the substrate is made of a first monocrystalline semi-conducting material.

6. Method according to claim 1, wherein crystallization being performed by a localized solidification step, the substrate has a lower thermal stabilization characteristic time than that of the electrically insulating thin layer.

7. Method according to claim 6, comprising before said localized solidification step:
   a step of forming transverse passages between the substrate and the preselected first active zones near the interface regions of said preselected first active zones,
   and a step of filling said transverse passages with a thermally conducting material.

8. Method according to claim 7, wherein the heat conducting material filling said transverse passages is the first monocrystalline semi-conducting material.

9. Method according to claim 1, wherein crystallization of the second semi-conducting material in monocrystalline form is followed by a removal step of the passivation layer and by an insulation step between the first and second active zones.

10. Method according to claim 1, wherein the first and second materials have an identical crystalline structure.

11. Method according to claim 1, wherein the first material is chosen from silicon and a silicon and germanium alloy.

12. Method according to claim 1, wherein the second material is chosen from germanium and a silicon and germanium alloy.

13. Method according to claim 1, wherein the front face of the support is chemically stable with respect to the second material.

14. Use of a method according to claim 1 for fabrication of C-MOS structures, wherein the first and second active zones being respectively made of silicon and germanium, n-MOS transistors are formed in the first active zones and p-MOS transistors are formed in the second active zones.

* * * * *